US010063028B2

(12) United States Patent
Behfar et al.

(10) Patent No.: US 10,063,028 B2
(45) Date of Patent: Aug. 28, 2018

(54) HIGH SMSR UNIDIRECTIONAL ETCHED LASERS AND LOW BACK-REFLECTION PHOTONIC DEVICE

(71) Applicant: MACOM TECHNOLOGY SOLUTIONS HOLDINGS, INC., Lowell, MA (US)

(72) Inventors: Alex A Behfar, Keswick, VA (US); Alfred T Schremer, Jr., Freeville, NY (US); Cristian Stagarescu, Ithaca, NY (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 78 days.

(21) Appl. No.: 14/528,450

(22) Filed: Oct. 30, 2014

(65) Prior Publication Data

US 2015/0049777 A1 Feb. 19, 2015

Related U.S. Application Data

(62) Division of application No. 12/895,979, filed on Oct. 1, 2010, now Pat. No. 8,891,576, which is a division
(Continued)

(51) Int. Cl.
*H01S 5/10* (2006.01)
*H01S 5/0687* (2006.01)
(Continued)

(52) U.S. Cl.
CPC ........ *H01S 5/0287* (2013.01); *G02B 6/12004* (2013.01); *H01S 5/0687* (2013.01);
(Continued)

(58) Field of Classification Search
CPC .... H01S 5/005; H01S 5/1085; H01S 5/06817; H01S 5/0687
See application file for complete search history.

(56) References Cited

U.S. PATENT DOCUMENTS 4,405,236 A 9/1983 Mitsuhashi et al.
4,464,762 A 8/1984 Furuya
(Continued)

FOREIGN PATENT DOCUMENTS

EP 1130717 A2 9/2001
GB 2228339 A 8/1990

OTHER PUBLICATIONS

Behfar-Rad, et al., "Etched Facet AlGaAs triangular-shaped ring lasers with output coupling," Appl. Phys. Lett. 59 (12):1395-1397, Sep. 16, 1991.
(Continued)

*Primary Examiner* — Marcia Golub-Miller
(74) *Attorney, Agent, or Firm* — Wilmer Cutler Pickering Hale and Dorr LLP

(57) ABSTRACT

Unidirectionality of lasers is enhanced by forming one or more etched gaps in the laser cavity. The gaps may be provided in any segment of a laser, such as any leg of a ring laser, or in one leg of a V-shaped laser. A Brewster angle facet at the distal end of a photonic device coupled to the laser reduces back-reflection into the laser cavity. A distributed Bragg reflector is used at the output of a laser to enhance the side-mode suppression ratio of the laser.

10 Claims, 4 Drawing Sheets

Related U.S. Application Data of application No. 10/802,734, filed on Mar. 18, 2004, now Pat. No. 7,817,702.

(60) Provisional application No. 60/455,562, filed on Mar. 19, 2003.

(51) Int. Cl.

| | | |
|---|---|---|
| *H01S 5/028* | (2006.01) | |
| *H01S 5/068* | (2006.01) | |
| *G02B 6/12* | (2006.01) | |
| *H01S 5/125* | (2006.01) | |
| *H01S 5/00* | (2006.01) | |
| *H01S 5/065* | (2006.01) | |
| *H01S 5/14* | (2006.01) | |

(52) U.S. Cl.
CPC ........ *H01S 5/06817* (2013.01); *H01S 5/1021* (2013.01); *H01S 5/1071* (2013.01); *H01S 5/1085* (2013.01); *H01S 5/125* (2013.01); *H01S 5/005* (2013.01); *H01S 5/0085* (2013.01); *H01S 5/0656* (2013.01); *H01S 5/1082* (2013.01); *H01S 5/14* (2013.01)

(56) References Cited

U.S. PATENT DOCUMENTS

| | | | |
|---|---|---|---|
| 4,575,658 A | | 3/1986 | Kay |
| 4,851,368 A | | 7/1989 | Behfar-Rad et al. |
| 4,952,019 A | | 8/1990 | Evans et al. |
| 4,965,525 A | * | 10/1990 | Zah ............... 359/344 |
| 4,986,661 A | | 1/1991 | Vick |
| 5,031,190 A | | 7/1991 | Behfar-Rad |
| 5,088,105 A | * | 2/1992 | Scifres et al. .......... 372/92 |
| 5,088,824 A | | 2/1992 | Killpatrick et al. |
| 5,132,983 A | | 7/1992 | Behfar-Rad |
| 5,241,555 A | | 8/1993 | Spitzer |
| 5,403,775 A | | 4/1995 | Holonyak, Jr. et al. |
| 5,434,426 A | | 7/1995 | Furuyama et al. |
| 5,463,705 A | | 10/1995 | Clauberg et al. |
| 5,504,772 A | | 4/1996 | Deacon et al. |
| 5,521,754 A | | 5/1996 | Nitta et al. |
| 5,696,779 A | | 12/1997 | Welch et al. |
| 5,764,681 A | | 6/1998 | Ballantyne et al. |
| 5,793,521 A | | 8/1998 | O'Brien et al. |
| 5,848,090 A | | 12/1998 | Zoll et al. |
| 5,914,978 A | | 6/1999 | Welch et al. |
| 6,043,104 A | | 3/2000 | Uchida et al. |
| 6,543,029 B1 | | 4/2003 | Sandorfi |
| 6,546,029 B2 | | 4/2003 | Sirbu et al. |
| 6,680,961 B2 | | 1/2004 | Behfar |
| 6,839,376 B2 | | 1/2005 | Goto |
| 7,817,702 B2 | | 10/2010 | Behfar et al. |
| 8,891,576 B2 | | 11/2014 | Behfar et al. |
| 2002/0021732 A1 | * | 2/2002 | Numai ............ G01C 19/66 372/94 |
| 2002/0163943 A1 | | 11/2002 | Lano et al. |
| 2003/0026316 A1 | | 2/2003 | Behfar |
| 2003/0108080 A1 | | 6/2003 | Behfar |
| 2005/0047727 A1 | | 3/2005 | Shin et al. |

OTHER PUBLICATIONS

Coldren, et al., "Analysis and Design of Coupled-Cavity Lasers—Part 1: Threshold Gain Analysis and Design Guidelines," IEEE Journal of Quantum Electronics, vol. QE-20, No. 6, pp. 659-670, Jun. 1984.

Coldren, et al., "Etched Mirror and Groove-Coupled GaInAsP/InP Laser Devices for Integrated Optics", IEEE Journal of Quantum Electronics, vol. QE-18, No. 10, pp. 1679-1688, Oct. 1982.

Marcuse, "DFB Laser with Attached External Intensity Modulator," IEEE Journal of Quantum Electronics, vol. 26, No. 7, pp. 262-269, Feb. 1990.

* cited by examiner

HIGH SMSR UNIDIRECTIONAL ETCHED LASERS AND LOW BACK-REFLECTION PHOTONIC DEVICE

The disclosure of the application on which this application claims the benefit under 35 U.S.C. 119(e), U.S. Provisional Application No. 60/455,562, filed Mar. 19, 2003, is hereby incorporated herein by reference.

BACKGROUND OF THE INVENTION

1. Field of the Invention

The present invention relates, in general, to a method and apparatus for providing unidirectional emission from an etched laser cavity and for providing low back-reflection from photonic devices, and in particular to photonic devices coupled to the laser output. More particularly, the invention relates to V-shaped lasers and triangular ring lasers with etched gaps to control the unidirectionality of emissions at the outputs of the lasers by providing high side-mode suppression and to the use of an etched facet at or near a Brewster angle to minimize back-reflection in a photonic device.

2. Description of the Background Art

Advances in current monolithic integration technology have allowed lasers of a variety of geometries to be fabricated, including V-shaped lasers and triangular ring lasers, as described, for example, in Applied Physics Letters, 59, pp. 1395-97, 16 Sep. 1991. These developments expand the prospective applications for integrated semiconductor lasers and add the attractiveness of greater manufacturability and reduced cost. This technology has opened the opportunity to explore new and novel features that can be combined inside and outside the laser cavity.

Copending U.S. patent application Ser. No. 10/226,076, filed Aug. 23, 2002, entitled "Wavelength Selectable Device" and assigned to the assignee hereof, the disclosure of which is hereby incorporated herein by reference, discloses monolithic structures that prevent back-reflection from the entrance facet of an element such as an electroabsorption modulator (EAM) into a laser cavity serving as a light source for the element by appropriate selection of the geometry of the device. Unidirectional emitting lasers would be desirable in such configurations to maximize the coupling of laser light into an EAM or other such elements.

As is known, a ring cavity laser possess benefits that a Fabry-Perot cavity does not have; for example, a ring cavity will produce lasing action with higher spectral purity than can be obtained with a Fabry-Perot cavity. Monolithic triangular ring lasers as well as other types of ring lasers and their integrated couplings have been described in the prior art, as well as in copending U.S. patent application Ser. No. 09/918,544 filed Aug. 1, 2001, entitled "Curved Waveguide Ring Lasers," now U.S. Pat. No. 6,680,961, issued Jan. 20, 2004 and assigned to the assignee hereof, the disclosure of which is hereby incorporated by reference. In addition, unidirectional behavior in ring lasers also has been described in the prior art.

Over the past few years, thanks mainly to the popularity of the Internet, the demand for bandwidth has experienced explosive growth. Carrier companies and their suppliers have addressed this demand by installing Wavelength Division Multiplexing (WDM) systems which allow multiple wavelengths of laser light to be transmitted through a single strand of optical fiber. One of the main requirements of lasers used in WDM systems is that the laser sources have spectral purity, with the result that most of the power of the laser must be concentrated in a narrow wavelength range. A laser source has a large number of possible longitudinal modes, and although it has the tendency to operate in the one longitudinal mode that leads to the maximum gain, some other modes are also partially amplified, causing it to generate optical radiation in different wavelengths and reducing its spectral purity.

The use of a gap for improvement of the spectral characteristics of a Fabry-Perot laser that operates with standing waves was proposed by Larry A. Coldren and T. L. Koch, "Analysis and Design of Coupled-Cavity Lasers—Part 1: Threshold Gain Analysis and Design Guidelines," IEEE Journal of Quantum Electronics, Vol. QE-20, No. 6, pp. 659-670, June 1984. As described, a gap was introduced between two cleaved facets to achieve coupling between different cavities, resulting in an improved mode discrimination depending on the lengths of the cavities and the gap. However, due to the inherent difficulty in building accurately positioned cleaved facets and the tolerances involved in placing two cleaved cavities in close proximity to each other to form a gap, large-scale manufacture of these lasers did not materialize. Etched mirror and groove coupled devices were demonstrated by Larry A. Coldren, et al., in "Etched Mirror and Groove Coupled GaInAsP/InP Laser Devices for Integrated Optics," IEEE Journal of Quantum Electronics, Vol. QE-18, No. 10, pp. 1679-1688, October 1982. However, these etched facets where not equivalent in reflectivity to cleaved facets and the etched versions of these devices were less efficient than their cleaved counterparts. U.S. Pat. No. 4,851,368 taught a process that allowed etched laser facets to be fabricated that were equivalent in reflectivity to cleaved facets.

SUMMARY OF THE INVENTION

The present invention is directed to a new and novel technique for obtaining unidirectionality in semiconductor photonic devices such as ring lasers and in V-shaped lasers, based on the provision of an etched gap or gaps in such lasers, and more particularly to the position of such a gap or gaps with respect to the output facet in a ring laser or with respect to the length of the legs in a V-shaped laser. In addition, this invention is directed to the formation of semiconductor lasers with at least one etched gap to enhance the side-mode suppression ratio (SMSR); i.e., the difference between the power of the main laser wavelength and the side-lobes, in such lasers. Furthermore, the invention is directed to using a facet formed on photonic devices such as optical amplifiers, electroabsorption modulators, or the like at or near the Brewster angle to prevent back-reflection in such a device.

In a preferred form of the invention, unidirectionality in semiconductor lasers is enhanced by forming at least one air gap in the laser cavity, or waveguide, with each gap being defined by spaced apart facets to enhance the side-mode suppression ratio in that cavity. The gaps are provided, for example, by etching through the cavity of a ridge-type ring or V-shaped laser which is integrally fabricated on the surface of a substrate. The gap or gaps may be etched in any leg of the laser cavity, and may be etched at 90° to the laser axis or, alternatively, at an angle to the axis. In the latter case, the gaps may be etched in spaced-apart pairs, with the waveguide segment between the gaps being offset to compensate for refraction at the etched facets. In another form of the invention, when the laser output is coupled to a photonic device, back-reflection is minimized by the provision of a facet at the Brewster angle at the distal end of the photonic device.

BRIEF DESCRIPTION OF THE DRAWINGS

The foregoing, and additional objects, features, and advantages of the present invention will become evident from the following detailed description of preferred embodiments thereof, taken with the accompanying drawings, in which.

DETAILED DESCRIPTION OF PREFERRED EMBODIMENTS

Figure 1:
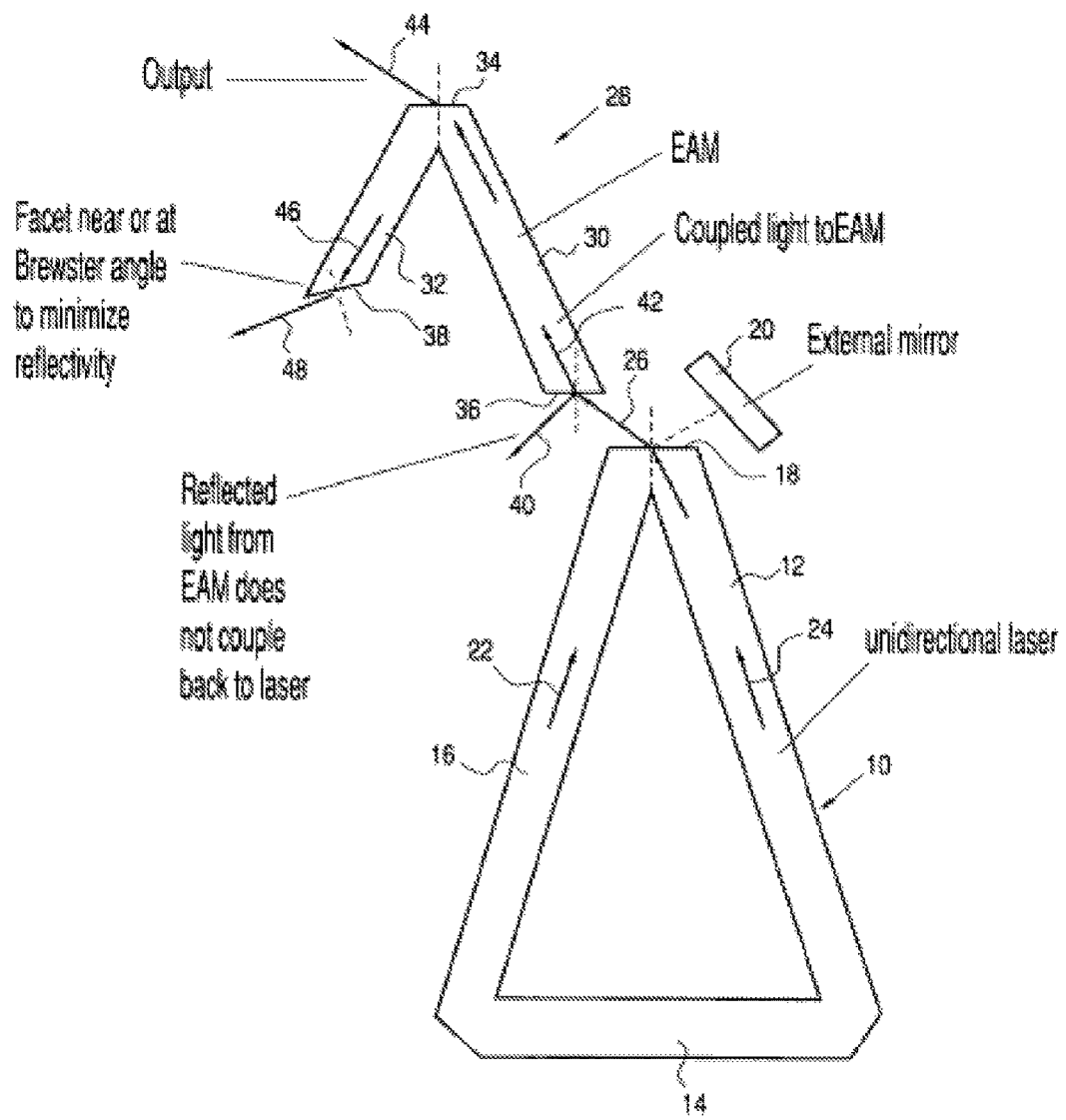
FIG. 1 is a schematic illustration of coupled monolithic structures arranged to prevent back-reflection from interfering with laser operation.

FIG. 1 illustrates a photonic device in the form of a monolithic, unidirectional, triangular ring laser cavity 10 having legs 12, 14, and 16, with legs 12 and 16 joining at an exit facet 18. Unidirectionality is obtained in laser 10 by the provision of an external mirror 20, which reflects the clockwise light 22 propagating in the laser and emitted at exit facet 18 back into the laser to reinforce the counterclockwise light 24. A portion of the light 24 is emitted at facet 18 as beam 26, which is coupled into another photonic device 28 such as a semiconductor optical amplifier (SOA), an electroabsorption modulator (EAM), or the like. In the illustrated arrangement, the device 28 is a V-shaped EAM which includes first and second legs 30 and 32 joined at respective first ends at an output facet 34, with the second end of leg 30 having an inlet facet 36 positioned to receive emitted beam 26, and the second end of leg 32 terminating at its extreme, or distal, end at a facet 38, which is at the Brewster angle to minimize reflectivity.

As described in the aforesaid application Ser. No. 10/226,076, undesirable back reflection from an external device such as the photonic device 28 may be reduced by locating input facet 36 in such a way as to couple beam 26 into leg 30 while ensuring that any light 40 reflected from facet 36 will not be coupled back into laser 10. In this manner, the geometry of the device 28 with respect to laser 10 minimizes back coupling; however, this reduces the amount of light that can be coupled into the device 28. To maximize coupling of light from the laser to the modulator, direct coupling can be utilized, where the input facet of device 28 directly influences the performance of the laser, for example, by increasing reflectivity.

In accordance with one aspect of the present invention, back-reflection to a laser from a photonic element such as the EAM 28 is minimized by the provision, at the extreme distal end of the device 28, of a facet 38 at or near the Brewster angle. With this configuration, light 42, which is coupled into the device 28, propagates in leg 30 and strikes facet 34 below the critical angle to cause an output beam 44 to be emitted. Light 46, which is the portion of light 42 which is internally reflected at facet 34, propagates in leg 32, strikes facet 38, and is emitted as beam 48 instead of being internally reflected back. In this way, light in device 28 that is not emitted as output beam 44 will not reflect back into laser 10, and this will prevent excess chirp from being produced in the laser. For a complete discussion of modulator facet induced laser chirp, see, for example, "DFB laser with attached external intensity modulator" by D. Marcuse, IEEE Journal of Quantum Electronics, Volume 26, Issue 2, Pages 262-269, February 1990.

Although the laser described in FIG. 1 is a prior art unidirectional ring laser 10, it will be understood that a photonic device 28 with facet 38 at or near the Brewster angle can be coupled with a variety of other types of lasers. It will also be understood that the entrance facet 36 can be at perpendicular incidence to directly couple device 28 to the laser.

Figure 2:
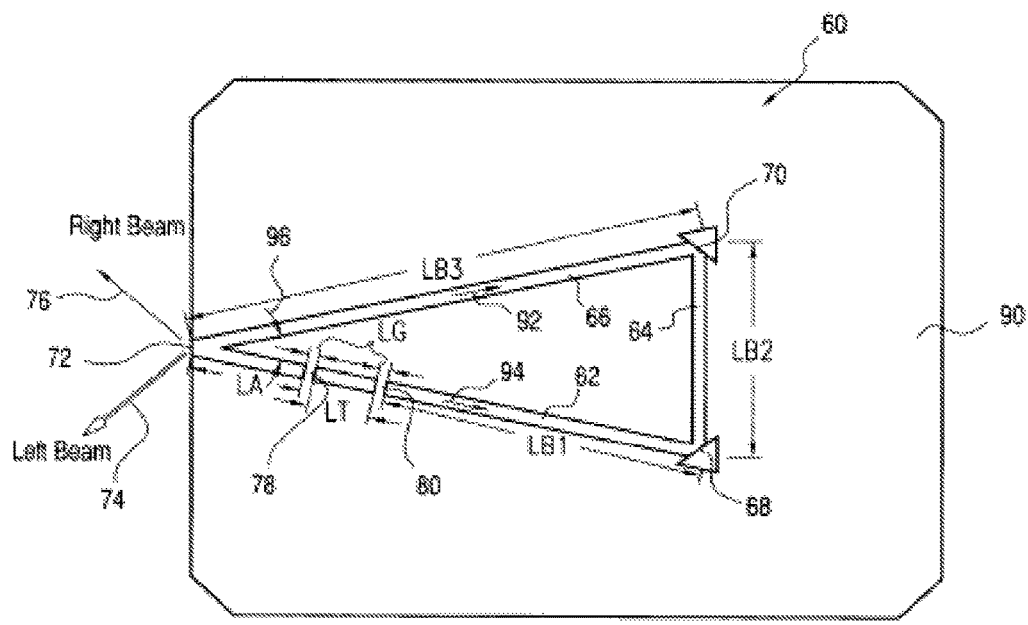
FIG. 2 is a schematic illustration of a triangular ring laser cavity laser with two deep etched gap regions in accordance with the present invention.

Another aspect of the invention is illustrated in FIG. 2, wherein at least one gap is provided in a ring laser cavity 60, and wherein the size of such a gap and the lengths of the laser elements making up the cavity determine the spectral characteristics of the laser by improving its side-mode suppression ratio (SMSR) and its unidirectionality. In the illustrated embodiment, the ring laser 60 is triangular, and includes legs 62, 64 and 66 joined at facets 68, 70 and 72. Facets 68 and 70 are fully internally reflecting, while facet 72 is an outlet facet which emits counter-rotating light beams 74 and 76. In the illustrated embodiment, two deep gaps 78 and 80 are etched completely through the leg 62, with each having a gap length LG. The length of the segment of leg 62 between facet 72 and gap 78 is identified as LA; the length of the segment of leg 62 between gap 78 and gap 80 is identified as LT; and the length of the segment of leg 62 between gap 80 and facet 68 is identified as LB1. The lengths of legs 64 and 66 are identified as LB2 and LB3, so the total length LB, or perimeter length, of the optical cavity is:

$$LB = LA + LT + LB1 + LB2 + LB3 + 2LG$$

The angle between legs 62 and 66 is selected so that output facet 72 has an angle smaller than the critical angle, and because of the gaps 78 and 80 in leg 62, the counterclockwise (left) output beam 74 is stronger than the clockwise (right) output beam 76. It will be understood that the output beam 74 may be directed to a suitable photonic device such as the EAM 28 of FIG. 1.

Figure 3:
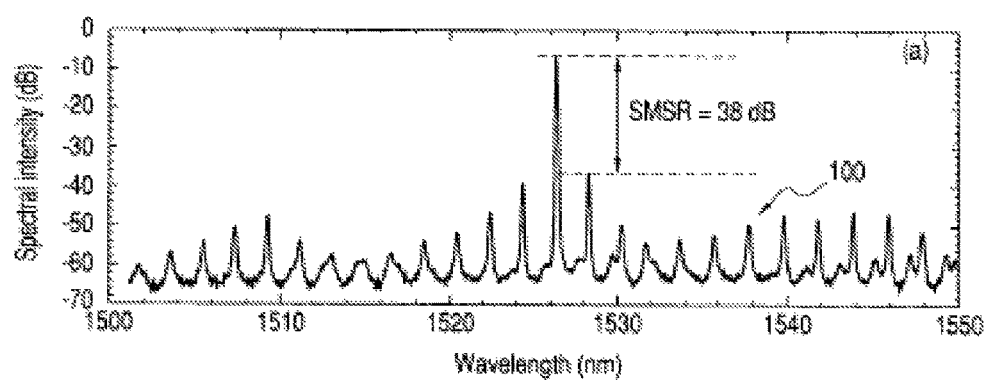
FIG. 3 illustrates a measured spectrum of the triangular ring laser of FIG. 2.

The size of the gaps 78 and 80 and lengths of the various leg elements forming the ring laser cavity 60 determine the spectral characteristics of the laser. By adding a single gap such as gap 78, the laser cavity 60 is divided into two cavities coupled by an air interface. Using two gaps 78 and 80 separated by an intermediate cavity section LT divides the laser into three cavities: LA, LT, and the combination of LB1, LB2 and LB3, that are coupled successively by the gaps. An example of the spectral efficiency of such a device is illustrated in FIG. 3.

In one form of the invention, the triangular laser cavity 60 is a monolithic ridge waveguide structure fabricated on an indium phosphide (InP) substrate 90, with a total length LB of 350 μm. The cavity is suitably biased, in known manner, to generate light, which will propagate in both the clockwise direction, indicated by arrow 92, and the counterclockwise direction, indicated by arrow 94. The legs 62 and 66 of the ring laser cavity meet at facet 72 at an angle 96 selected to produce an angle of incidence of about 12° for light propagating in the cavity.

Figure 4:
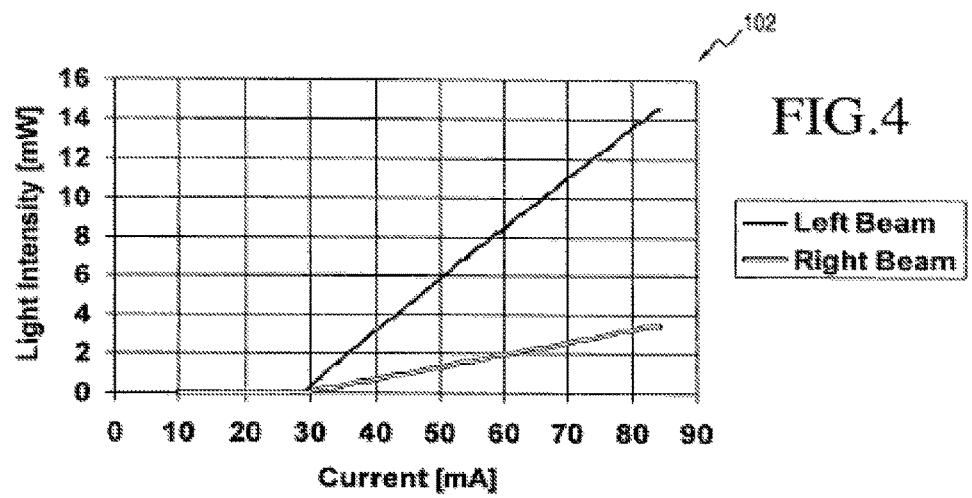
FIG. 4 is a graphical illustration of the unidirectional behavior of the ring laser of FIG. 2.
Figure 5A:
FIGS. 5(a) to 5(f) illustrate basic configurations for a triangular ring cavity with etched gaps in accordance with the invention.
Figure 5B:
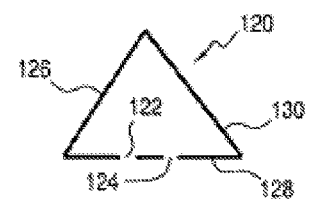
Figure 5C:
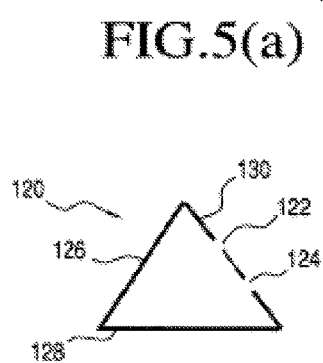
Figure 5D:
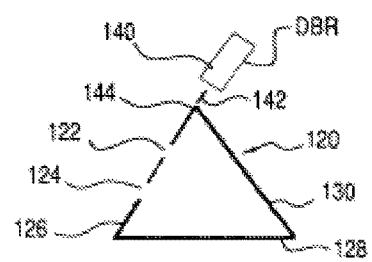
Figure 5E:
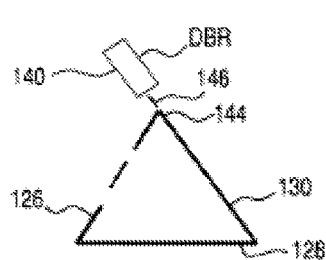
Figure 5F:
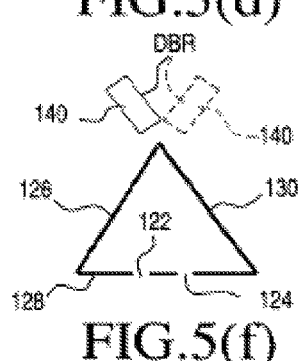

To produce a high side-mode suppression output from the laser cavity, as well as unidirectional behavior, at least one air gap is provided in one leg of the cavity. In the illustrated embodiment, two air gaps are etched through cavity leg 62, each gap being about 3 µm wide, through, for example, photolithography and etching, with the gaps being separated by a cavity section LT of about 17.5 µm. These etched gaps produce interference between the cavity sections, which leads to the oscillation of one longitudinal mode in the laser cavity. This produces a side-mode suppression ratio (SMSR) of about 38 dB, as illustrated by curve 100 in FIG. 3, which is the measured spectrum of the light propagating in the counterclockwise direction to produce the output left beam 74. The etched gaps result in a substantially unidirectional emission of light from the cavity. As illustrated by the graphs 102 of FIG. 4, the left beam 74 light is about five times as intense as the right beam 76 light.

The total length LB of the laser cavity can vary widely and preferably is between about 10 µm and 10,000 µm. Additionally, the number of gaps can vary, and preferably will be between 1 and 10 gaps positioned anywhere along the length of the ring laser cavity. Each gap preferably is between about 0.001 µm and about 10 µm in length and will extend completely through the cavity.

FIGS. 5(*a*) to 5(*f*) illustrate examples of several possible configurations for ring lasers with etched gaps. In these examples, two gaps are used, although it will be understood that fewer or more gaps can be provided, as discussed above. In FIG. 5(*a*), a triangular ring laser 120 incorporates two gaps 122 and 124 in a left-hand cavity segment, or leg, 126, in FIG. 5(*b*) the gaps 122 and 124 are located in a bottom cavity segment, or leg, 128, of laser 120, and in FIG. 5(*c*) the gaps 122 and 124 are located in a right-hand cavity segment 130 of laser 120.

FIGS. 5(*c*) through 5(*f*) illustrate laser cavity configurations utilizing an external photonic element such as a Bragg reflector (DBR) located adjacent the laser outlet facet. In FIG. 5(*d*), laser 120 incorporates gaps 122 and 124 in left-hand segment 126, and includes DBR element 140 aligned with arm 126 for reflecting the clockwise (right) beam 142 emitted by the outlet facet 144 of ring laser 120. In this case, the DBR device is located for reflection into the arm nearest the gaps and results in enhanced unidirectionality. In FIG. 5(*e*), the DBR device 140 is located for reflection into the arm farthest from the etched gaps, and thus is aligned with arm 130 to reflect the counterclockwise light emitted as beam 146 from facet 144. In this case, the SMSR is enhanced by this structure.

FIG. 5(*f*) illustrates an embodiment wherein the DBR 140 is located for reflection into either arm 126 or arm 130 when the gaps 122 and 124 are located in the central arm 128. This structure is a compromise between increased SMSR and unidirectionality.

Other configurations may also be provided, as by incorporating gaps in both the left and right arms, with or without DBR devices.

Etched gaps, such as those illustrated at 78 and 80 in FIG. 2 and at 122 and 124 in FIGS. 5(*a*)-5(*f*) may be formed during the fabrication of the laser cavity in which they are located, or may be separately fabricated by etching the substrate before formation of the cavity or by etching the cavity after it has been fabricated. Such etching may be carried out using conventional photolithographic techniques for locating the gaps and for selecting their width.

Figure 6A:
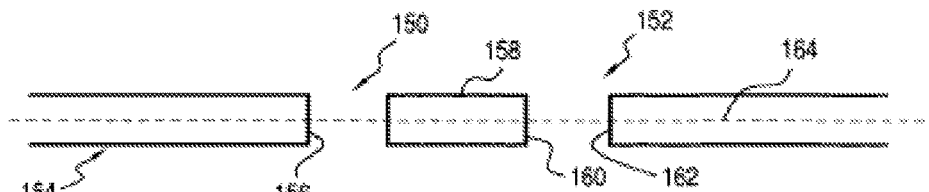
FIGS. 6(a) and 6(b) illustrate double air gaps separated by (a) a flat angle facet air gap and (b) an angled facet air gap.
Figure 6B:
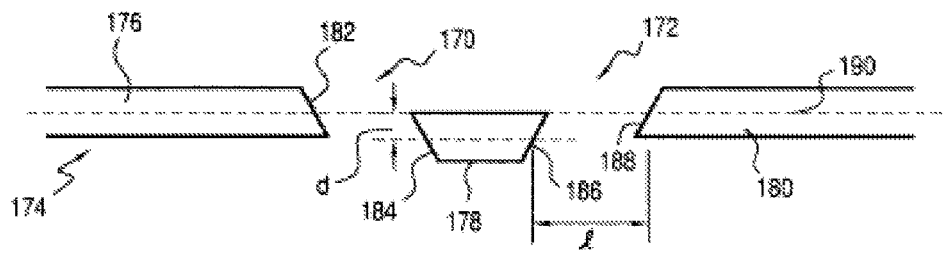

As illustrated in FIGS. 6(*a*) and 6(*b*), the ends of the gaps are defined by facets which the etching process forms in the laser cavity. Thus, for example, in the embodiment of FIG. 6(*a*), first and second gaps 150 and 152 are fabricated by etching away portions of a laser cavity or waveguide 154, and forming facets in the waveguide at ends 156 and 158 of gap 150 and at ends 160 and 162 of gap 152. These facets may be flat; i.e., at 90° with respect to the axis 164 of the waveguide, in a preferred form of the invention.

In the embodiment of FIG. 6(*b*), angled facets are formed at the gaps, in which case the adjoining waveguide segments are offset to compensate for the refraction of light at the interfaces of the laser cavity and the air gaps. In the illustrated embodiment, two air gaps 170 and 172 are provided in a waveguide 174, the air gaps dividing the waveguide into segments 176, 178 and 180. The ends of air gap 170 are formed by parallel angled facets 182 and 184 in segments 176 and 178, respectively, while the ends of air gap 172 are formed by parallel angled facets 186 and 188 in segments 178 and 180, respectively. The facets 182, 184 are angled in a direction opposite to that of facets 186, 188, and the centerline of waveguide segment 178 between the gaps is displaced from the centerline 190 of waveguide 174 to compensate for the refraction of light as it passes throughout the facets into the air gaps and then back into the waveguide. The displacement distance d is related to the angle of the facets with respect to the centerline and to the length l of the air gaps. The angled facets increase the efficiency of a unidirectional ring laser and improve the intensity of the desired output beam (the left beam in FIG. 2) with respect to the output beam being suppressed (the right beam in FIG. 2) by suppressing reflected waves over the traveling waves propagating in the laser cavity. Although two gaps are illustrated in FIG. 6(*b*), it will be understood that a different number of gaps can be provided. Further, it will be understood that the displacement of the cavity segments with respect to the centerline of the cavity may be established photolithographically in the laser fabrication process.

Figure 7A:
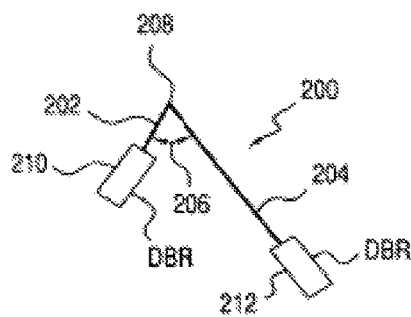
FIGS. 7(a) and 7(b) illustrate a V-shaped cavity with DBR reflectors (a) without air gaps and (b) with air gaps.
Figure 7B:
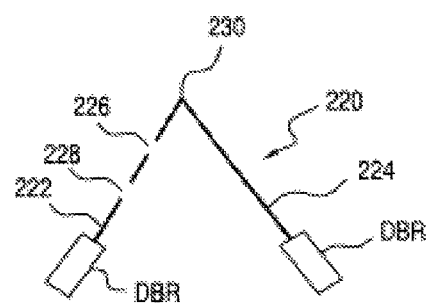

Another embodiment of the invention is illustrated in FIGS. 7(*a*) and 7(*b*), wherein the ring-type laser discussed with respect to FIGS. 1-6 is replaced by a V-shaped laser cavity 200. The laser of FIG. 7(*a*) incorporates first and second legs 202 and 204 fabricated on a substrate at an angle 206 with respect to each other and intersecting at an outlet facet 208, from which light is emitted. The unidirectionality of the laser is established by the relative lengths of the legs 202 and 204. DBR reflectors 210 and 212 may be provided at the free ends of the legs 202 and 204, respectively, to reduce threshold currents and to provide improved performance.

As illustrated in FIG. 7(*b*), unidirectionality in a V-shaped laser cavity 220 is enhanced by incorporating at least one air gap in one of the intersecting legs 222, 224 making up the cavity. In this embodiment, two spaced air gaps 226 and 228 are located in leg 222, with these gaps increasing the SMSR in the cavity to provide an improved unidirectionality at the output facet 230. As illustrated, this embodiment may also employ DBR reflectors 232 and 234 at the free ends of legs 222 and 224, respectively to improve its performance.

The air gap structure of the present invention serves to significantly reduce, or prevent, back-reflection when a ring cavity or a V-shaped cavity laser is coupled to another photonic element, such as the EAM device described with respect to FIG. 1. Back reflection is further reduced by the use of a Brewster angle in the photonic element, as at the far end of the EAM in FIG. 1.

Although the present invention has been illustrated in terms of preferred embodiments, it will be understood that variations and modifications may be made without departing from the true spirit and scope thereof as set out in the following claims.

What is claimed is:

1. A semiconductor photonic device, comprising:
   a substrate;
   an epitaxial structure deposited on said substrate;
   a cavity having at least one segment formed in said epitaxial structure, said cavity forming a photonic element including an entrance facet and an exit facet; and
   a laser with a high side mode suppression ratio formed in said epitaxial structure, said laser having a plurality of legs and an output facet for emitting an output beam that is coupled to said entrance facet of said photonic element, said laser output facet and said photonic element entrance facet being positioned relative to one another so that any portion of said output beam emitted from said laser output facet and reflected from said photonic element entrance facet is not coupled back into said laser, thereby reducing back reflection of light from said photonic device to said laser, wherein each of said plurality of legs has a respective length and total width, and wherein at least one of said plurality of legs has a plurality of air gaps each formed completely through the total width of said at least one leg to divide said at least one leg into separate leg sections.

2. The photonic device of claim 1, wherein said cavity is V-shaped and wherein said at least one segment includes a first leg and a second leg.

3. The photonic device of claim 2, further including an etched facet at or near the Brewster angle at a first, free end of said first leg of said cavity for further reducing back reflections.

4. The photonic device of claim 3, wherein said first and second legs have second ends that are joined to form said V-shaped cavity, and wherein said exit facet is positioned at a joint formed between said first and second legs.

5. The photonic device of claim 4, wherein said entrance facet is formed at a first, free end of said second leg of said V-shaped cavity.

6. The photonic device of claim 1, wherein said laser is selected from the group comprising a ring laser and a V-shaped laser.

7. The photonic device of claim 6, wherein said laser is a unidirectional laser.

8. The photonic device of claim 7, wherein said unidirectional laser has an external mirror to reflect light from said output facet back into said laser.

9. The photonic device of claim 7, wherein said plurality of air gaps each formed completely through the total width of said at least one leg comprises two gaps for enhancing the high side mode suppression ratio and unidirectionality of said laser.

10. The photonic device of claim 1, wherein said photonic element is selected from the group comprising an electroabsorption modulator and a semiconductor optical amplifier.

* * * * *